(12) United States Patent
Catalano (10) Patent No.: US 9,347,642 B2
(45) Date of Patent: May 24, 2016

(54) FACETED OPTICS FOR ILLUMINATION DEVICES

(75) Inventor: Anthony Catalano, Boulder, CO (US)

(73) Assignee: TerraLUX, Inc., Longmont, CO (US)

( * ) Notice: Subject to any disclaimer, the term of this patent is extended or adjusted under 35 U.S.C. 154(b) by 260 days.

(21) Appl. No.: 13/606,106

(22) Filed: Sep. 7, 2012

(65) Prior Publication Data

US 2013/0058104 A1    Mar. 7, 2013

Related U.S. Application Data

(60) Provisional application No. 61/531,675, filed on Sep. 7, 2011.

(51) Int. Cl.
| | |
|---|---|
| *F21V 5/04* | (2006.01) |
| *F21V 7/00* | (2006.01) |
| *F21V 7/06* | (2006.01) |
| *G02B 19/00* | (2006.01) |
| *F21Y 101/02* | (2006.01) |
| *F21Y 105/00* | (2016.01) |
| *H01L 33/58* | (2010.01) |

(52) U.S. Cl.
CPC ............... *F21V 5/04* (2013.01); *F21V 7/0091* (2013.01); *F21V 7/06* (2013.01); *G02B 19/0009* (2013.01); *G02B 19/0066* (2013.01); *F21Y 2101/02* (2013.01); *F21Y 2105/001* (2013.01); *H01L 33/58* (2013.01)

(58) Field of Classification Search
CPC ......... F21V 7/06; F21V 5/046; F21V 7/0091; F21Y 2101/02; F21Y 2105/001
USPC ................................................... 362/335, 361
See application file for complete search history.

(56) References Cited

U.S. PATENT DOCUMENTS

| | | |
|---|---|---|
| 4,602,321 A | 7/1986 | Bornhorst |
| 5,789,766 A | 8/1998 | Huang et al. |
| 5,806,955 A | 9/1998 | Parkyn, Jr. et al. |

(Continued)

FOREIGN PATENT DOCUMENTS

| | | |
|---|---|---|
| CN | 102958251 A | 3/2013 |
| DE | 202010016958 U1 | 6/2011 |

(Continued)

OTHER PUBLICATIONS

Parkyn W. A. et al. "Converging TIR lens for nonimaging concentration of light from compact incoherent sources". (Nov. 1, 1993), available online at [http://proceedings.spiedigitallibrary.org/proceeding.aspx?articleid=935891] (last accessed on Jul. 7, 2013).

(Continued)

*Primary Examiner* — Sean Gramling
(74) *Attorney, Agent, or Firm* — Neugeboren O'Dowd PC (57) ABSTRACT

Faceted optics for use in conjunction with (typically planar) arrangements of discrete light sources (e.g., an array of multiple LED dies) improve or optimize the trade-off between beam divergence and beam non-uniformity, and between non-uniformities resulting from the imaging of the extended light source and artifacts introduced by the optic itself.

25 Claims, 9 Drawing Sheets

(56) References Cited

U.S. PATENT DOCUMENTS

| | | | |
|---|---|---|---|
| 5,986,819 A | 11/1999 | Steinblatt | |
| 6,357,893 B1 | 3/2002 | Belliveau | |
| 6,488,398 B1 | 12/2002 | Bloch et al. | |
| 6,566,824 B2 | 5/2003 | Panagotacos et al. | |
| 6,796,690 B2 | 9/2004 | Bohlander | |
| 6,985,627 B2 | 1/2006 | Banton | |
| 7,006,306 B2 | 2/2006 | Falicoff et al. | |
| 7,329,029 B2 | 2/2008 | Chaves et al. | |
| 7,605,547 B2 | 10/2009 | Ng | |
| 7,758,208 B2 | 7/2010 | Bailey | |
| 7,808,581 B2 | 10/2010 | Panagotacos et al. | |
| 8,436,554 B2 | 5/2013 | Zhao et al. | |
| 2008/0062682 A1 | 3/2008 | Hoelen et al. | |
| 2008/0238338 A1 | 10/2008 | Latham et al. | |
| 2009/0046303 A1 | 2/2009 | Dimitrov-Kuhl et al. | |
| 2009/0046454 A1* | 2/2009 | Bertram et al. | 362/231 |
| 2009/0219716 A1* | 9/2009 | Weaver et al. | 362/235 |
| 2010/0065860 A1 | 3/2010 | Vissenberg et al. | |
| 2010/0097809 A1* | 4/2010 | Munro et al. | 362/308 |
| 2010/0296283 A1 | 11/2010 | Taskar et al. | |
| 2011/0108860 A1 | 5/2011 | Eissler et al. | |
| 2011/0149581 A1 | 6/2011 | Jiang | |
| 2011/0182065 A1 | 7/2011 | Negley et al. | |
| 2011/0260647 A1 | 10/2011 | Catalano et al. | |
| 2012/0014107 A1 | 1/2012 | Avila | |
| 2012/0018745 A1 | 1/2012 | Liu et al. | |
| 2012/0043563 A1 | 2/2012 | Ibbetson et al. | |
| 2013/0058103 A1* | 3/2013 | Jiang et al. | 362/296.05 |
| 2013/0076804 A1 | 3/2013 | Tanaka et al. | |
| 2013/0170220 A1 | 7/2013 | Bueeler et al. | |
| 2014/0084809 A1 | 3/2014 | Catalano | |
| 2015/0009677 A1 | 1/2015 | Catalano | |

FOREIGN PATENT DOCUMENTS

| | | | |
|---|---|---|---|
| DE | 102012201494 A1 | 8/2012 | |
| EP | 2093482 A2 | 8/2009 | |
| JP | 3-270561 A | 12/1991 | |
| WO | WO-2005060376 A2 | 7/2005 | |
| WO | 2007/067513 A2 | 6/2007 | |
| WO | WO-2008152561 A1 | 12/2008 | |
| WO | WO-2010015820 A1 | 2/2010 | |
| WO | WO-2010127217 A1 | 11/2010 | |
| WO | WO-2011062629 A1 | 5/2011 | |
| WO | 2014/047621 A1 | 3/2014 | |
| WO | 2015/006478 A1 | 1/2015 | |

OTHER PUBLICATIONS

"A.Leda Top Performance Moving Head LED-Wash", Clay Paky S.p.A, 2013, 8 pages.

International Application Serial No. PCT/US2013/061378, International Search Report and Written Opinion mailed on Nov. 29, 2013, 10 pages.

Doucet et al., "New Concept for a Wide-Angle Collimated Display", SPIE Proceedings, vol. 7100, Available Online at <http://spie.org/Publications/Proceedings/Paper/10.1117/12.797778>, Sep. 27, 2008, 1 page of Abstract only.

Henry, Dr. William, "MicroLED Arrays Find Applications in the Very Small", Photonics Spectra, Available Online at <http://www.photonics.com/article.aspx?AID=53224>, Mar. 2013, 6 pages.

Hernandez, I., "Highly Efficient Individually Addressable Diode Lasers at 830 nm Grown by Solid Source Molecular Beam Epitaxy", Superficies y Vacio 1, Dec. 2001, pp. 7-9.

Jeon et al., "Fabrication of Two-Dimensional InGaN-Based Micro-LED Arrays", Physica Status Solidi (A), vol. 129, Available online at <http://onlinelibrary.wiley.com/doi/10.1002/1521-396X(200208)192:2%3C325::AID-PSSA325%3E3.0.CO;2-Q/abstract;jsessionid=28053E8F815330B1FE38A4B697239322.f02t03>, Aug. 2002, 2 pages of Abstract only.

Neukum, Dr. JöRG, "High-Power Diode Laser Bars in the Printing Industry", Laser Technik Journal, vol. 4, Issue 4, Jul. 2011, pp. 22-23.

Poher et al., "Micro-Led Arrays: A Tool for Two-Dimensional Neuron Stimulation", Journal of Physics D: Applied Physics, vol. 41, 094014, 2008, pp. 1-9.

Rosenkrantz et al., "Light-Emitting Diode (LED) Arrays for Optical Recorders", SPIE Proceedings, vol. 020, Available online at <http://proceedings.spiedigitallibrary.org/proceeding.aspx?articleid=1229245>, Feb. 12, 1980, 1 page of Abstract only.

Skabara et al., "Low-Threshold Organic Semiconductor Lasers: Moving Out of the Laboratory", SPIE Newsroom, Nov. 29, 2010, 2 pages.

PCT International Patent Application No. PCT/US2013/061378, International Preliminary Report on Patentability issued Mar. 24, 2015, 6 pages.

PCT International Patent Application No. PCT/US2014/045997, International Search Report and Written Opinion mailed Jan. 5, 2015, 17 pages.

PCT International Patent Application No. PCT/US2014/045997, Invitation to Pay Additional Fees and Partial International Search, mailed Oct. 24, 2014, 5 pages.

* cited by examiner

FACETED OPTICS FOR ILLUMINATION DEVICES

CROSS-REFERENCE TO RELATED APPLICATION

The present invention claims priority to and the benefit of U.S. Provisional Application No. 61/531,675, filed on Sep. 7, 2011, the entire disclosure of which is hereby incorporated herein by reference.

TECHNICAL FIELD

In various embodiments, the present invention relates to optics for illumination devices incorporating multiple light-emitting diodes (LEDs), in particular optics that minimize beam spread while obscuring the LED dies.

BACKGROUND

Light-emitting diodes (LEDs) are increasingly being utilized as discrete light sources in various illumination devices. As with illumination devices based on other light sources (e.g., incandescent bulbs), lenses or other types of optics may be utilized to collimate and direct the light from the LEDs. When a small individual LED die is utilized in an illumination device, and when the exit area of the optic is large compared to the area of the die, the LED die effectively acts as a point source of light, and conventional optics, such as a parabolic reflector (e.g., a parabolically curved metal surface) or convex lens, may be utilized—with the LED placed at the focus of the optic—to form a collimated beam of light for general-illumination applications such as utility lights or flashlights.

However, to increase the light output from LED-based illumination devices, multiple LED dies are often used in a single device, e.g., arranged in an array, to form an extended light source. This entails two problems: First, as the total area of the light source increases in comparison to the exit area of the optic, the light source is no longer a point source, and collimation of the light becomes difficult. For example, whereas a point source placed at the focus of a parabolic reflector produces a collimated beam, an extended light source placed at the focal plane inevitably results in some degree of beam divergence. Second, for practical reasons (such as manufacturing limitations), an extended light source composed of multiple discrete light sources rarely forms a continuous, uniformly emitting surface. In an array of LED dies, for example, the individual dies are typically spaced apart, resulting in dark borders between the rows and columns. As the light is collimated (or nearly collimated), these dark borders appear in the beam profile, disrupting its uniformity.

For most general illumination applications, such as to highlight an article (for example, in a retail store) or to throw the light beam a long distance to increase visibility of distant objects (e.g., as with a flashlight), it is desirable to have a narrow (i.e., low-divergence) beam of light free of visual artifacts and with a high central beam intensity. The desire for such artifact-free beams is often at odds with the drive to produce high-brightness beams with multiple LED dies. Various approaches have been used to minimize the imaging (i.e., in-beam visibility) of individual dies in order to achieve bright, yet uniform beams. In general, however, the methods used to minimize the visibility of individual dies in an illumination device that contains many dies often conflict with the methods utilized to produce a narrow optical beam and the need to preserve high optical efficiency.

In one approach, features placed at the exit surface of the optic are used to disperse the beam, i.e., direct light away from the central axis. For example, the surface can be textured at small scales or incorporate periodic shapes or elements (such as arcs) that diverge the beam. (Such exit-surface dispersion optics are often called "pillow optics" since they consist of an array of curved surfaces resembling pillows.) The overlap between individual divergent beams resulting from the light-dispersing features may achieve a relatively uniform illuminated surface, but also causes undesirable broadening of the overall light beam. Likewise, more finely divided surfaces closer to the wavelength of the light can cause light scattering, again resulting in a divergent beam that obscures visual artifacts but is undesirably broadened. Furthermore, because the finely divided surface is easily damaged by contact and can be easily modified by contaminants that change the interfacial optical properties, exit-surface light dispersion is unsuitable for many applications.

In another approach, which is often used in traditional reflectors, the surface of the optic is faceted, i.e., approximated by multiple (typically planar) surface segments. Faceting moves the light slightly off the central axis. By faceting over the entire surface of the reflector, imaging of the light source may be prevented—but once again at the expense of broadening the light beam. Hence, faceting is often used in floodlights. In general, the larger the facets, the more obscured the non-uniformities of the light-emitting surface will be. However, larger facets themselves introduce artifacts in the light beam, thus undermining the beam uniformity they are intended to accomplish.

Accordingly, there is a need for alternative optics for illumination devices incorporating LED dies as their light sources that reduce non-uniformities resulting from the arrangement of the light sources while minimizing beam broadening and artifacts introduced by the optic itself.

SUMMARY

The present invention provides faceted optics for use in conjunction with (typically planar) arrangements of discrete light sources (e.g., an array of multiple LED dies) that overcome many of the problems of the prior art by improving or optimizing the trade-off between beam divergence and beam non-uniformity, and between non-uniformities resulting from the imaging of the extended light source and artifacts introduced by the optic itself. As utilized herein, a "faceted" optic refers to an optic whose reflective or refractive surface (as distinguished from the entrance and exit surfaces) is discontinuous along one more lines, resulting in multiple surface segments (the "facets") whose edges are formed by the discontinuities. In certain preferred embodiments, the facets are planar (i.e., do not have curvature), but collectively approximate a curved surface. For example, a parabolic surface may be approximated by many planar quadrilaterals whose vertices lie on a paraboloid. Facets that have (non-zero) curvature in one or both dimensions are, however, also within the scope of the present invention. Typically (but not necessarily), the optic is faceted in two dimensions: vertically, i.e., along the intersections of planes through the optical axis (which is, for a symmetric optic, the symmetry axis, with the surface of the optic), and azimuthally, i.e., along the intersections of planes perpendicular to the optical axis with the surface of the optic.

In various embodiments, the optic is a TIR optic, i.e., a solid block of transparent material of a refractive index that results in total internal reflection (TIR) of light emitted from the vicinity of its focus and incident upon the solid-air interface. An LED array placed at the focal plane of the TIR optic may serve as the extended light source. The TIR optic may take the form of a truncated paraboloid (which herein means that the vertices of the faceted optic lie on a parabolic surface) with parallel entrance and exit surfaces, where the entrance surface coincides with the focal plane. In certain embodiments, a central, refractive lens is provided at or near the exit surface of the TIR optic to capture light emitted in a direction diverging from the normal to the focal plane, which would otherwise not be collimated because of the finite extent of the TIR surface. This lens may, itself, be faceted.

The optics are designed—primarily via the number, size, and arrangement of their facets—to yield a substantially uniform beam of light, i.e., a beam that is substantially free of images of the discrete light sources or other optical artifacts. The number of facets in each direction (azimuthally and vertically) that results in desirable beam performance generally depends on other parameters of the illumination devices, such as the size and general shape of the optic, the total light-emitting area of the light source, the size of the dies, and/or the spacing between the dies.

As used herein, "substantially free of images" or "substantially free of artifacts" means that any images of the light source or artifacts are either not visible to the unaided human eye under ordinary viewing conditions, or are at least very subtle and, thus, tolerable. What level of non-uniformity is tolerable depends, generally, on the particular application and the requirements on other beam parameters (such as beam divergence). To quantify beam uniformity, the beam may be characterized in terms of its brightness (or luminous intensity), measured in units of candela. In some embodiments, the beam brightness (as measured in units of candela) in a cross-section of the beam varies locally by less than 5%, preferably less than 1%, more preferably less than 0.2%. A local variation in beam brightness is, herein, understood to be the variation in brightness (maximum to minimum) through the region of brightness reduction (e.g., a region where brightness is reduced as a result of visual artifacts).

In addition to being substantially free of artifacts, the beam preferably has a high central beam brightness and a low degree of divergence. The beam divergence is herein defined as the angle, taken in a plane that includes the optical axis, between two straight lines from the intersection of the optical axis and the light source (which is, typically, the center of the light source) to two points in a beam cross-section taken at a large distance from the light source where the luminous intensity of the beam has fallen off to half of its maximum intensity. Beam divergence, thus, relates directly to the width of the beam. The width (defined as the distance between the points of half-maximum intensity on both sides), and thus the beam divergence, generally increases if the maximum beam brightness is not at the center of the beam. Therefore, a dip in the beam brightness at the center generally correlates with a larger divergence.

Accordingly, in one aspect, the invention provides an optic for use in conjunction with an extended light source comprising a plurality of discrete light sources that includes a solid structure formed of a substantially transparent material and having an outer surface includes a plurality of planar facets collectively defining a faceted paraboloid. (The material may be considered substantially transparent if the optic transmits, e.g., at least 90%, preferably at least 95%, more preferably at least 99% of light entering at the entrance surface of the optic). The facets are sized and arranged such that a light beam exiting a first end of the optic, opposite a second end of the optic at which the extended light source is disposed, is substantially free of images of the discrete light sources and artifacts resulting from faceting. In various embodiments, the brightness of the beam varies locally by less than 3%, less than 1%, or even less than 0.3%. In some embodiments, the beam divergence angle exceeds a baseline beam divergence angle (as defined further below) by less than 5%.

In certain embodiments, the brightness of the beam is not substantially lower in a center than in regions surrounding the center (e.g., not lower by more than 10%, preferably not lower by more than 5%, more preferably not lower by more than 3%), even if the optic is used in conjunction with an extended light source that does not emit light at the symmetry axis of the paraboloid. In other words, the beam may have a substantially uniform center portion (despite a light source not emitting at the center, i.e., at the axis of the paraboloid).

The solid structure may have a convex lens surface at an axis of the paraboloid, which may be recessed or protrude from the first end of the optic. In some embodiments, he convex lens surface is faceted. For example, it may be divided into two facets in a vertical direction. The total angular coverage of the convex lens and the paraboloid (as defined further below) may exceeds 75°, and preferably 80° or even 85°.

In some embodiments, the outer surface of the optic (and/or the convex lens surface) is divided into at least thirty and no more than sixty facets in an azimuthal direction. A vertical angular extent of the planar facets of the outer surface may be in the range from about 5° to about 10°. In some embodiments, all of the facets have substantially the same vertical angular extent (with variations, e.g., resulting from manufacturing inaccuracies, being less than 3%, preferably less than 1%). In particular embodiments of an optic for use in conjunction with an extended light source comprises twelve light-emitting diodes, the outer surface of the optic has an angular extent of about 50.5° and is divided into eleven facets into a vertical direction and into 54 facets in an azimuthal direction. In various embodiments, the total number of facets of the optic is in the range from about fifty times to about one hundred times the number of discrete light sources within the extended light source.

The second end of the optic may coincide with the focal plane of the paraboloid. The paraboloid may be truncated at the second end. The solid structure may have a concave entrance face recessed from the second end for receiving light from the plurality of discrete light sources.

In another aspect, the invention relates to an optic (for use in conjunction with an extended light source comprising a plurality of discrete light sources) that includes a solid structure formed of a substantially transparent material and having an outer surface comprising a plurality of planar facets collectively defining a faceted paraboloid, with facets sized and arranged such that a light beam exiting a first end of the optic, opposite a second end of the optic at which the extended light source is disposed, is substantially uniform in brightness (i.e., it is locally substantially uniform across the entire beam cross-section, where uniformity may be characterized in terms of the local variations in beam brightness, as explained above) and has a beam divergence angle that exceeds a baseline beam divergence (as defined below) by less than 10%. The characteristics and features of various embodiments described above with regard to the first aspect are applicable here as well.

In yet another aspect, various embodiments of the invention are directed to an optic (for use in conjunction with an plurality of discrete light sources collectively forming an extended light-emitting surface) that includes a solid structure formed of a substantially transparent material and defining a truncated paraboloid and a convex lens surface along and oriented normally to an axis of the truncated paraboloid. The surface of the truncated paraboloid and the surface of the convex lens are faceted so as to substantially eliminate non-uniformities of the extended light-emitting surface in a beam exiting the solid structure at the exit surface. In some embodiments, non-uniformities are deemed substantially eliminated if they are not visible to the unaided eye under ordinary viewing conditions. In some embodiments, non-uniformities are deemed substantially eliminated if local variations in beam brightness do not exceed 5% (or, preferably, 1% or 0.2%). The optic may have various characteristics and features as described above with regard to other aspects of the invention.

BRIEF DESCRIPTION OF THE DRAWINGS

The foregoing will be more readily understood from the following detailed description, in particular, when taken in conjunction with the drawings, in which.

DETAILED DESCRIPTION

Figure 1:
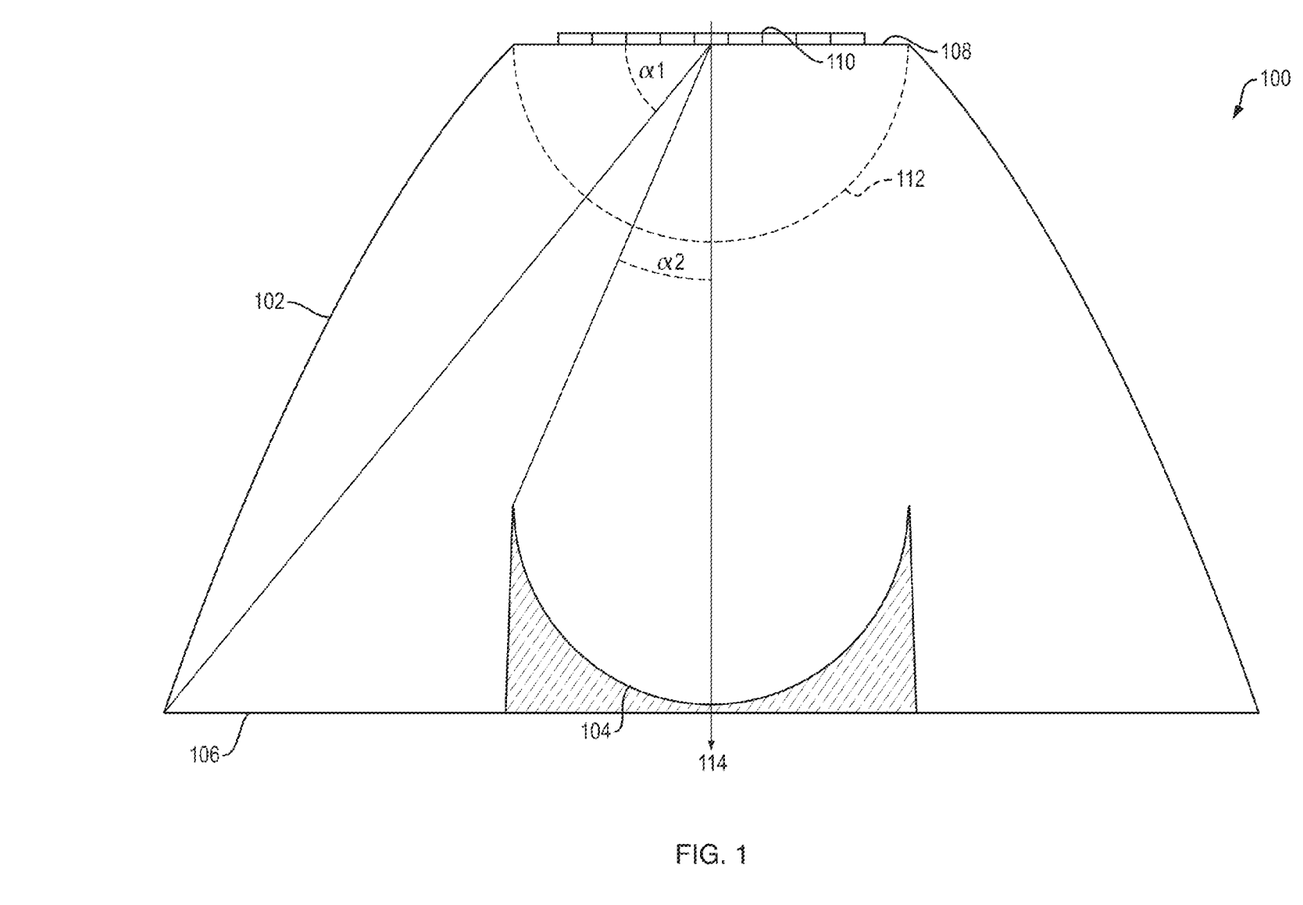
FIG. 1 is a schematic side view of a parabolic optic with a central lens feature.

Faceting can, generally, be applied to optics of various types and geometric shapes (including, e.g., purely refractive optics or spherical optics) to obscure the discrete components of an extended light source. Various embodiments of the present invention relate, in particular, to cylindrically symmetric optics including a parabolic reflector and a central lens, as shown conceptually in FIG. 1. (FIG. 1 illustrates the overall shape and configuration of the optic, and, for simplicity, omits the facets. Note, however, that, in embodiments of the present invention, the optic is generally modified to include one or more faceted surfaces, as illustrated in various figures described below.) The reflector and central lens may form an integral structure 100, e.g., made of a solid block of transparent material (e.g., glass or a polymer such as acrylic or polycarbonate) that provides an internally reflective outer parabolic surface 102 and includes a convex lens surface 104 recessed from an exit surface 106 of the optic. The lens surface 104 may be located at a suitable depth within the paraboloid or, alternatively, may protrude from the exit surface 106; recessing the lens is advantageous in that it saves material and, thus, production cost of the optic 100. (Instead of being convex when viewed from the exit surface 106 (toward the LED array), the lens may be recessed from the entrance surface of the optic and convex when viewed from that direction (toward the exit surface). The depicted location and orientation of the lens is, however, preferred.)

The optic 100 is truncated at the focal plane 108 of the paraboloid, where an LED array 110 or other extended light source may be placed. If the array 110 has bare LED die, it may couple light directly into the solid structure 100 via a flat entrance surface. Alternatively, the structure 100 may feature a curved (e.g., semi-spherical) cut-out at the focal plane 108 that provides a concave air-solid interface serving as a curved entrance surface 112 (indicated by a dashed line) that is preferably parallel to the convex lens surface 104 such that light undergoes little or no refraction on its path from the LED array to the convex lens 104. The curved surface here is "parallel" (at least the tangents are) to the exit surface (lens) of the LED. Therefore the light undergoes little or no refraction in making the transition from LED to lens.

Light from the LED array 110 that is incident on either the parabolic walls 102 or the central convex lens 104 is directed straight ahead, approximately parallel to the optical axis 114—in other words, it is collimated (or focused at infinity). Because the LED array emits a large portion of the light along the optical axis 114, the convex lens 104 is important for increasing the central beam brightness. However, as illustrated further below, the central lens also enhances the undesirable imaging of the LED array; in some embodiments, it is, therefore, preferable to remove the central lens 104.

Light that intersects neither the parabolic surface 102 nor the central lens 104 is generally not collimated and, thus, contributes to the divergence of the generated optical beam. In general, the more light is captured collectively by the paraboloid 102 and central lens 104 (or, put differently, the larger the total angle of coverage provided by these two components of the optic 100), the better the beam will be collimated. Herein, the angle of coverage $\alpha_1$ of the reflector is defined as the angle, measured in a cross-sectional plane through the optical axis 114 (i.e., the symmetry axis of a paraboloid), between a horizontal line through the focus (i.e., the intersection of the cross-sectional plane through the axis with the focal plane) and a straight line from the focus to the edge of the reflector at the exit surface; this angle increases with the vertical extent of the paraboloid 102. The angle of coverage $\alpha_2$ of the central lens 104 is defined, in the same plane, as the angle between the optical axis 114 and a straight line from the focus of the reflector 102 to the edge of the central lens 104.

In various embodiments, the total angle of coverage ($\alpha_1 + \alpha_2$) is at least 75°, preferably at least 80°, more preferably at least 85°. The angle of coverage generally determines the minimum possible beam divergence (i.e., the narrowest possible beam) for any given light source. (For example, for a light source as illustrated in FIG. 2C and described further below, the minimum possible angle of divergence is about 12.4° if the reflector 102 covers 60° and the central lens covers 30°; a reflector coverage angle of 50° in combination with a central-lens coverage angle of 35° yields a minimum angle of divergence of about 15.9°; and a reflector coverage angle of 54° in combination with a central-lens coverage angle of 30° yields a minimum angle of divergence of about 18°.) The minimum possible beam divergence is, typically, the beam divergence achieved by smooth reflector and lens surfaces, which can be used as a baseline divergence against which the beam-broadening effect of faceting can be measured. (In applications where the light source does not emit at the optical axis, resulting in a local minimum in beam brightness at the center, faceting, although generally contributing to greater divergence, can effectively result in a slightly decreased beam divergence if it sufficiently obscures a "hole" in the center of the beam. Thus, the beam divergence of a perfectly smooth optic is, in this case, not the minimum possible divergence.)

Figure 2A:
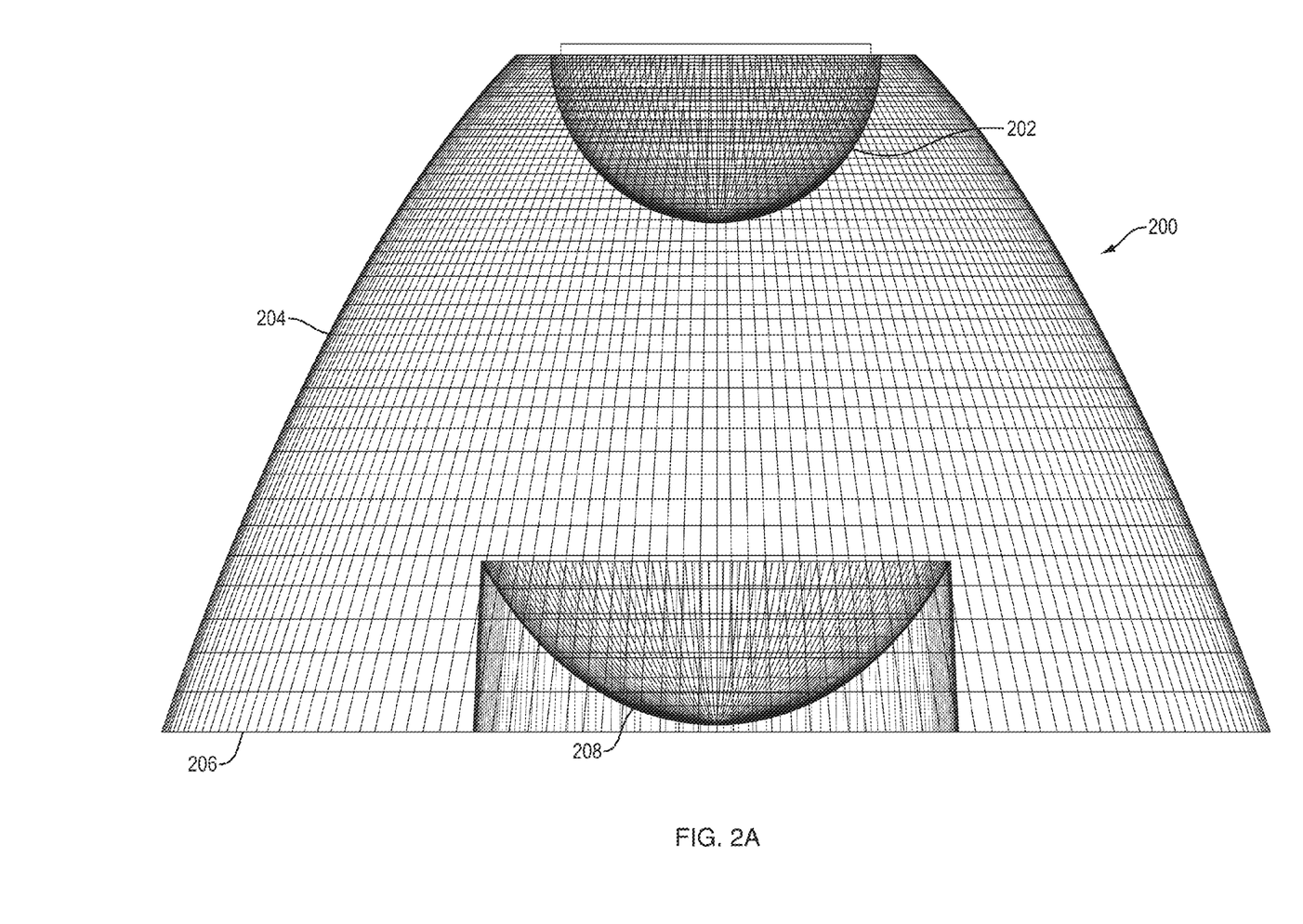
FIGS. 2A and 2B are side and bottom views, respectively, of a smooth parabolic optic with a smooth central lens feature.
Figure 2B:
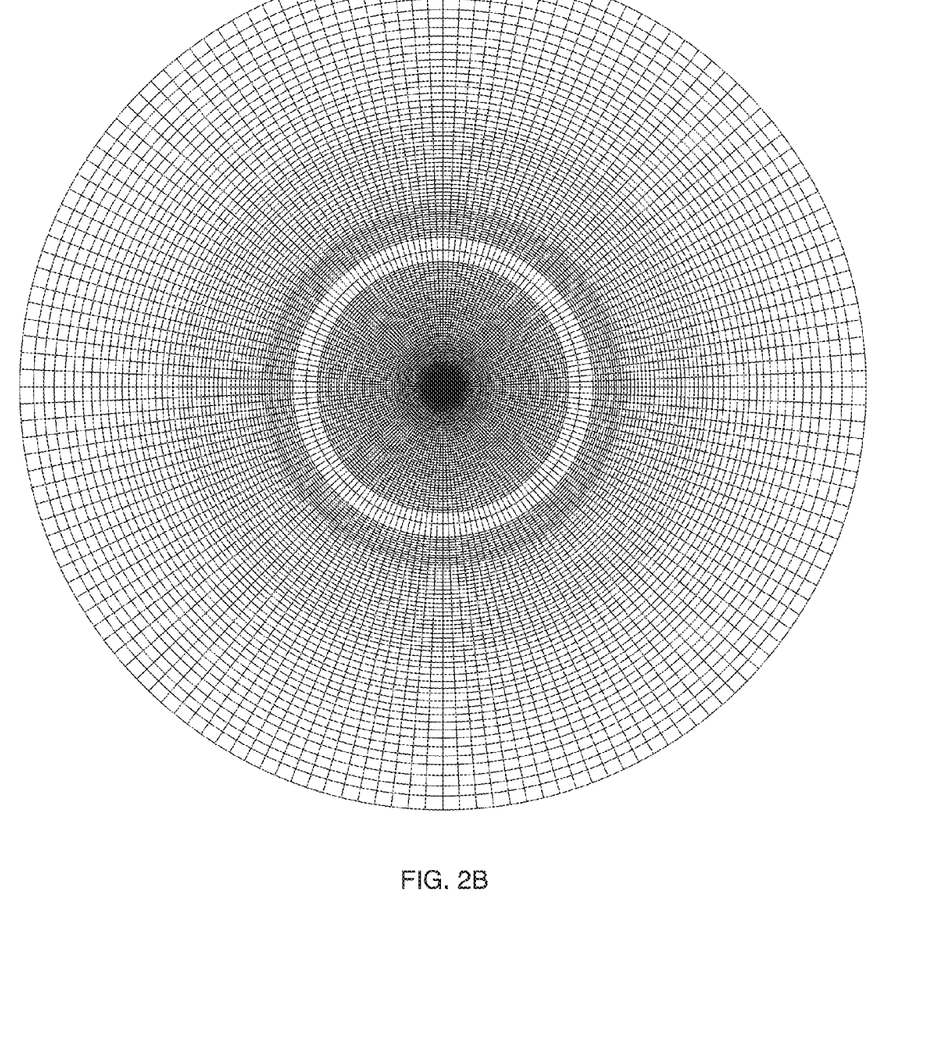
Figure 2C:
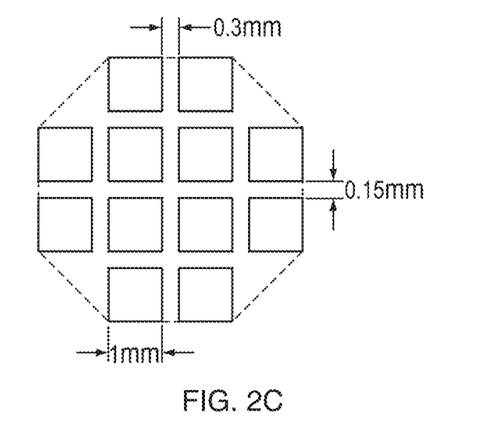
FIG. 2C is a top view of an LED array used in conjunction with the optic of FIGS. 2A and 2B and optics in accordance with various embodiments.

To illustrate the effect of faceting, consider first, for comparison, a conventional parabolic TIR optic, as illustrated in FIG. 2A. The TIR optic 200 features a curved entrance face 202, smooth parabolic walls 204, a flat exit face 206, and a recessed convex lens 208. A view of the convex lens 208 from below is provided in FIG. 2B, showing that the lens 208 has a continuous circular face and cross-section. The TIR optic 200 is used in conjunction with a regular array of twelve LED dies, arranged in four rows of two, four, four, and two dies, respectively, such that the corners of the array form a regular octagon, as shown in FIG. 2C. Each die has dimensions of 1×1 mm. The spacing between adjacent rows is about 0.15 mm, and the spacing between adjacent columns is about 0.3 mm.

Figure 3A:
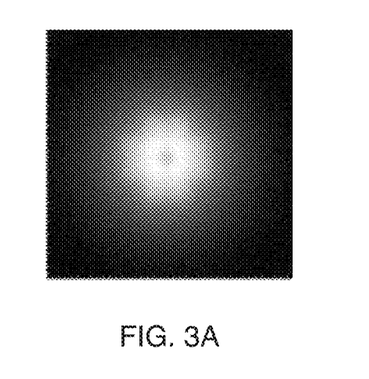
FIG. 3A is an image illustrating the beam profile generated with the LED array of FIG. 2C using the optic of FIGS. 2A and 2B.
Figure 3B:
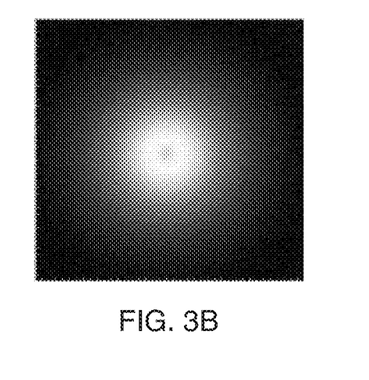
FIG. 3B is an image illustrating the beam profile generated with the LED array of FIG. 2C using a parabolic optic without a central lens feature.

FIG. 3A shows the beam profile resulting from the optic 200 at a one-meter-distance from the light source, as computer-simulated based on the parameters of the light source and optic. The optic 200 is, unfortunately, very effective at imaging the twelve dies contained in the LED package, rendering the spacing between the dies clearly visible in the form of darker lines in the beam profile. If the central convex feature 208 is removed, the situation is improved somewhat, as shown in FIG. 3B. Here, the individual dies are not well resolved, but the dark central spot at the center of the array (i.e., the intersection of the spacings between rows and columns), which emits no light, still causes the formation of a "donut hole" in the beam pattern; this is also highly undesirable. Moreover, removal of the central lens results in measurable beam broadening and, more importantly, a significant drop in the central beam brightness.

Figure 4A:
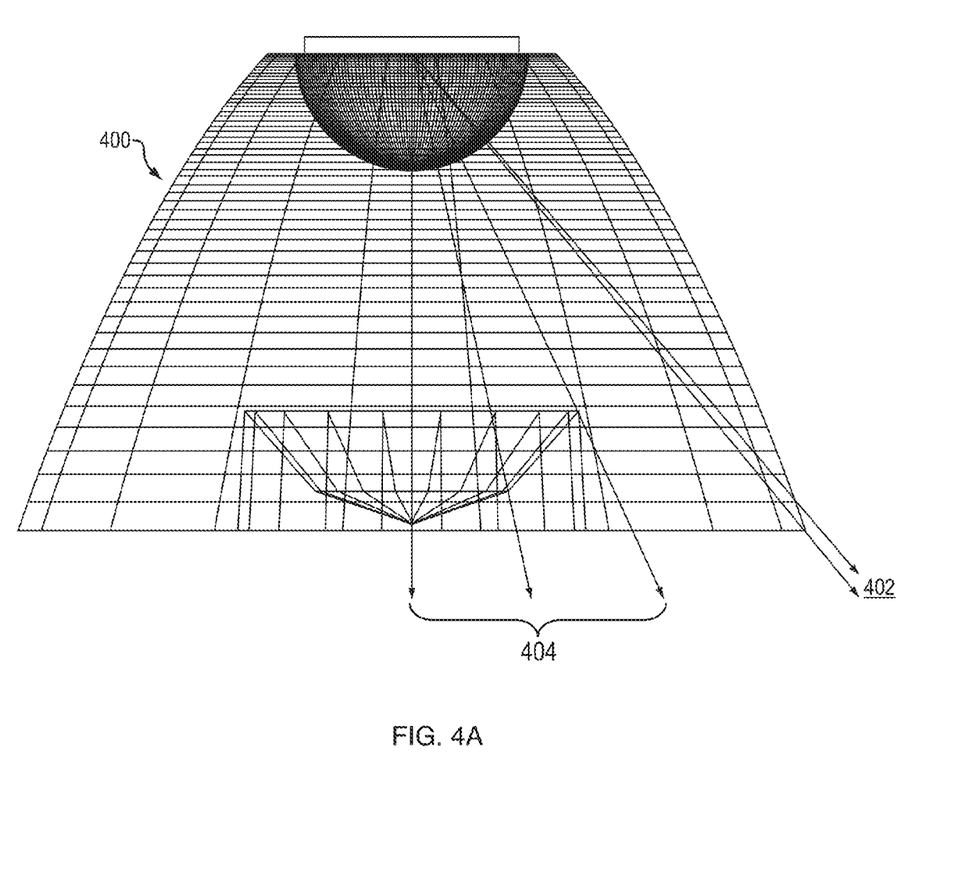
FIGS. 4A and 4B are top and bottom views, respectively, of a faceted parabolic optic with a faceted central lens feature in accordance with various embodiments.
Figure 4B:
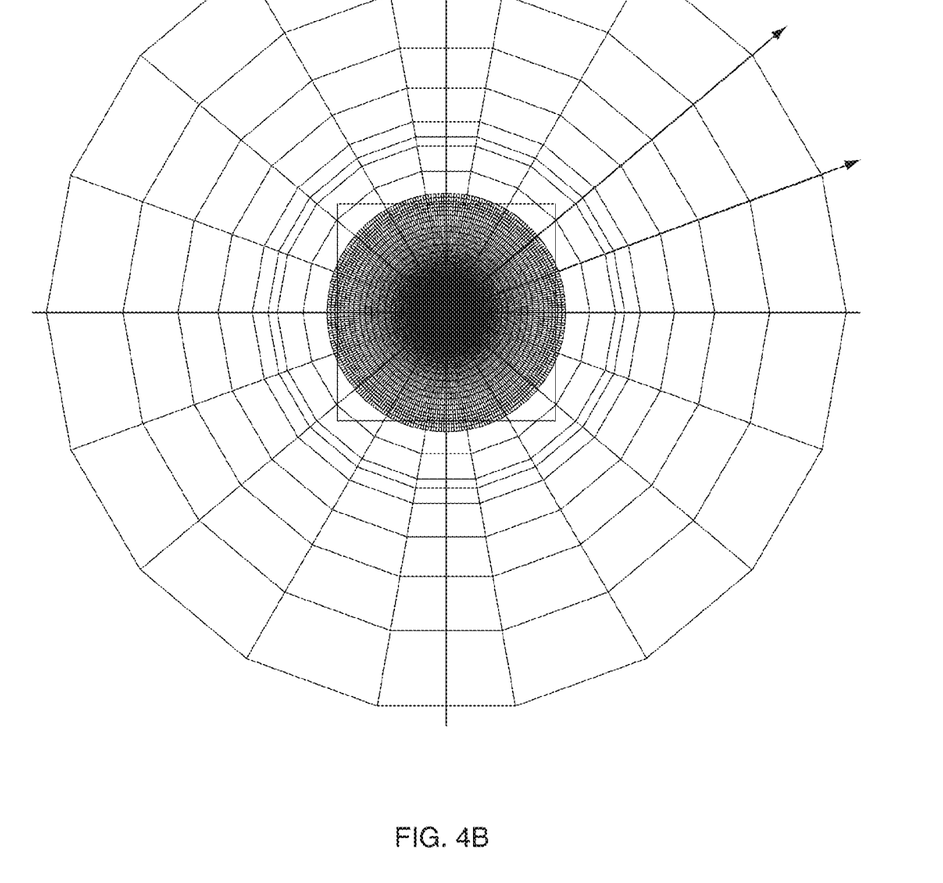

FIGS. 4A and 4B depict side and bottom views, respectively, of a parabolic optic 400, including a central lens, that is faceted in accordance with one embodiment of the present invention. The angular extent of paraboloid from the focal plane (i.e., the angle of coverage) is 50.5°. FIG. 4A shows arrows 402 extending from the center of the die array 404 to the horizontal edges of the facets at the surface of the paraboloid. In the illustrated example, the paraboloid is vertically segmented into 51 facets, each covering an angle of 1°. As a result of the constant angular coverage, the vertical extent of the facets is greater toward the exit surface of the optic. A larger increment in angle would result in a larger length of all facets in the vertical direction. The convex lens surface at the center of the optic 400 is, likewise, faceted, typically into only a few vertical facets. In the depicted example, the lens is divided into two facets, each comprising 45°, as indicated by arrows 404.

FIG. 4B shows faceting of the optic 400 in the azimuthal direction. In typical embodiments, the number of azimuthal facets is the same for both the paraboloid and the central lens (although it does not have to be). In the embodiment illustrated, each facet covers an azimuthal angle of 20°(corresponding to the angular separation of the radial lines), yielding a total of eighteen facets. (Here, the larger the angle specified, the larger will be the length of the facet in the horizontal plane.) Of course, as the annular extent of the facets in both the vertical and horizontal plane becomes small, the shape of the outer surface of the optic approaches that of a true paraboloid.

As a described earlier and shown in FIGS. 3A and 3B, the use of a perfect paraboloid and central convex lens yields undesirable beam non-uniformities because of the imaging of the array of LED dies. In a faceted optic, on the other hand, the facets generally create an overlapping pattern of the die images, resulting in a more uniform beam. The larger the facets, the more effectively any non-uniformities in the light source will be blurred in the beam. If the facets are larger than the area of an individual die, optical resolution of the individual dies is not achieved. However, increasing the angular extent of the facets so that they become large compared to the die area also yields unsatisfactory results, as the facets create their own unwanted artifacts. Thus, it may be desirable to utilize facets that are not excessively larger than the die (e.g., have a maximum area not exceeding ten times, or not exceeding five times, the area of the die.)

Figure 5:
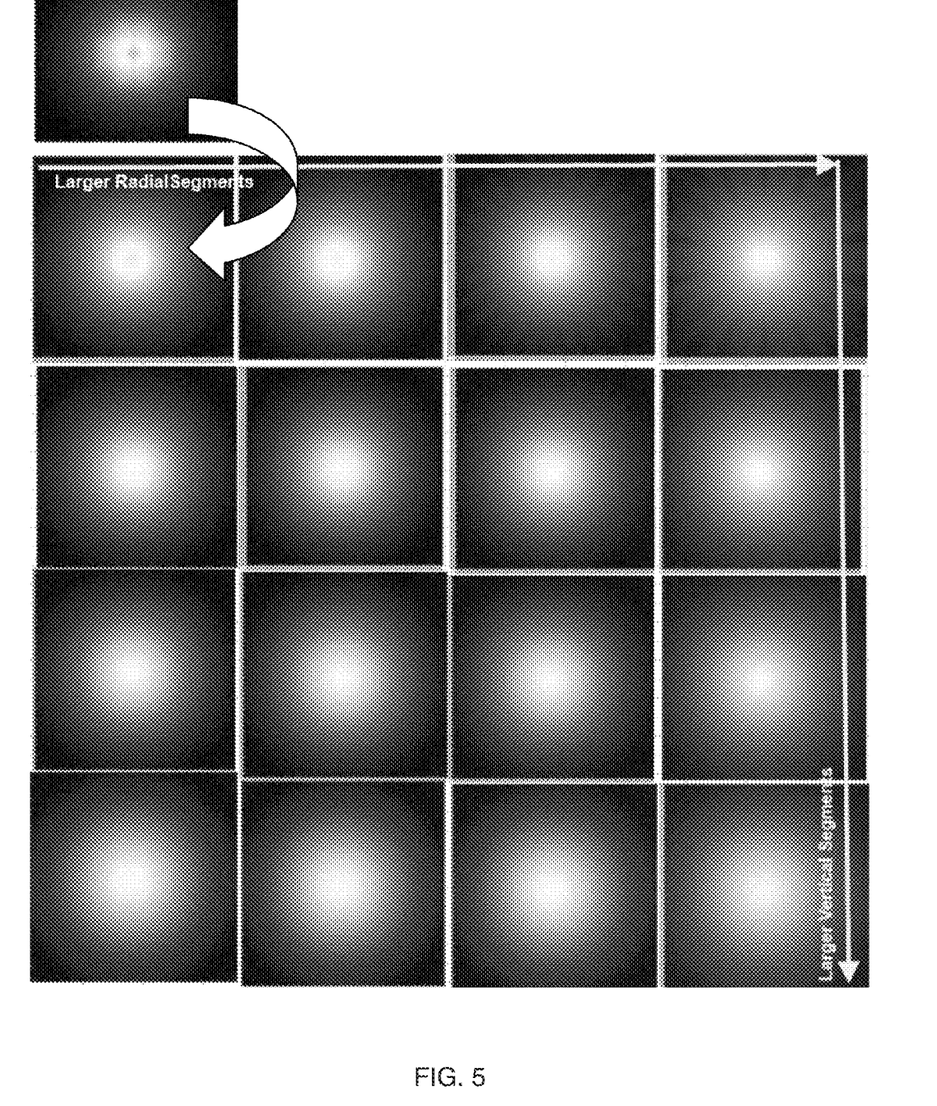
FIG. 5 shows beam profiles generated with the LED array of FIG. 2C using facet optics with various numbers of facets in accordance with various embodiments, illustrating the effect of different facet numbers in the vertical and azimuthal directions.

FIG. 5 illustrates the varying beam patterns that result from altering the azimuthal extent of the facets (rows in the figure) of the paraboloid and the central lens and the vertical extent of the facets (columns in the figure) of the paraboloid. The beam patterns are simulated for the same 12-die LED array as used in FIGS. 2A and 2B. All of the sixteen images in the 4×4-matrix of FIG. 5 were simulated for optics with a convex central lens feature segmented vertically into two facets covering 45° each. The top left image that is set apart from the matrix, by contrast, corresponds to a true circular cross-section and a true paraboloid (i.e., vanishingly small facets in both directions). It features deleterious imaging of the twelve dies within the LED array and a clear dark region in the center where no light is emitted by the array, and, thus, illustrates that the imaging of the dies becomes very clear when the convex feature of the exit face of the optic is made perfectly smooth. If the convex lens is faceted, a significant increase in center beam brightness can be achieved. For example, with a lens divided into two vertical, the center beam brightness increases by about 13%.

As shown in FIG. 5, when a smaller number of wide facets in the azimuthal direction is coupled with a larger number of short facets in the vertical direction (which results in a nearly true parabolic vertical cross-section), artifacts corresponding to the azimuthal faceting appear in the outer region of the emitted beam. For example, the upper right-hand image in FIG. 5, which couples dense vertical faceting with only eighteen azimuthal facets over the 360° circumference of the lens, clearly exhibits a star-shaped beam profile. However, as the parabola itself is made more coarse in the vertical direction by breaking its cross-section into fewer but longer linear segments (and thus deviating more from the true continuous parabolic curve and travelling downward in FIG. 5), it fails to resolve the star-shaped pattern created by the coarse circular features. At the same time, the larger facet size in the vertical direction increases the diameter of the beam's bright central region. So, while the undesirable outer feature is removed, this result is accompanied by an undesirable wider beam angle.

An optimum design, albeit somewhat subjective, lies near the center of the 4×4 matrix of FIG. 5. Here, the beam is narrow and has a bright beam center, while an examination of the structure of the beam by making contour plots of the image shows little if any resolution of the individual dies. These optics contain facets whose largest area is approximately the same as the area of the LED array. Designs that have a maximum facet area of about half the collective die area are preferred in many embodiments. (Because the facets each cover the same angle, their linear dimensions vary, so that the optics contain facets of smaller areas as well.)

Figure 6A:
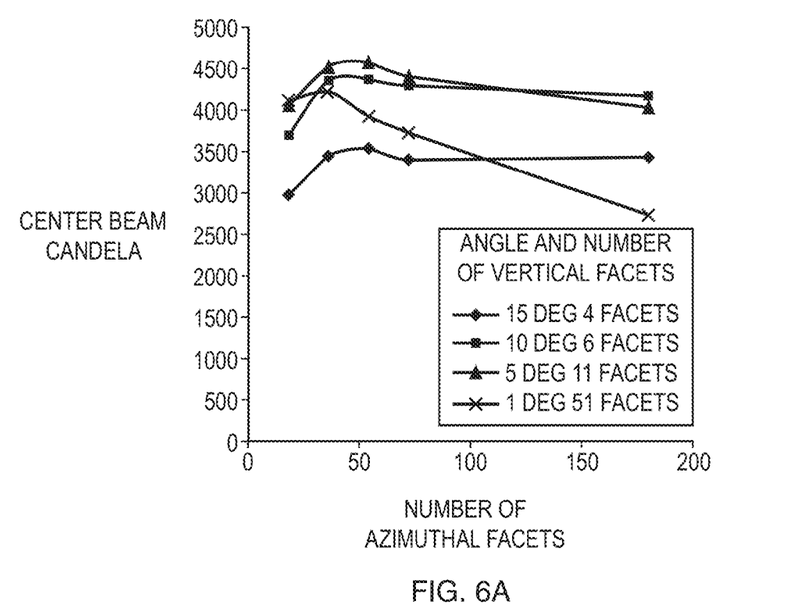
FIGS. 6A and 6B are graphs illustrating the center brightness and divergence of a beam generated with the LED array of FIG. 2C using facet optics with various numbers of facets vertical and azimuthal directions in accordance with various embodiments.
Figure 6B:
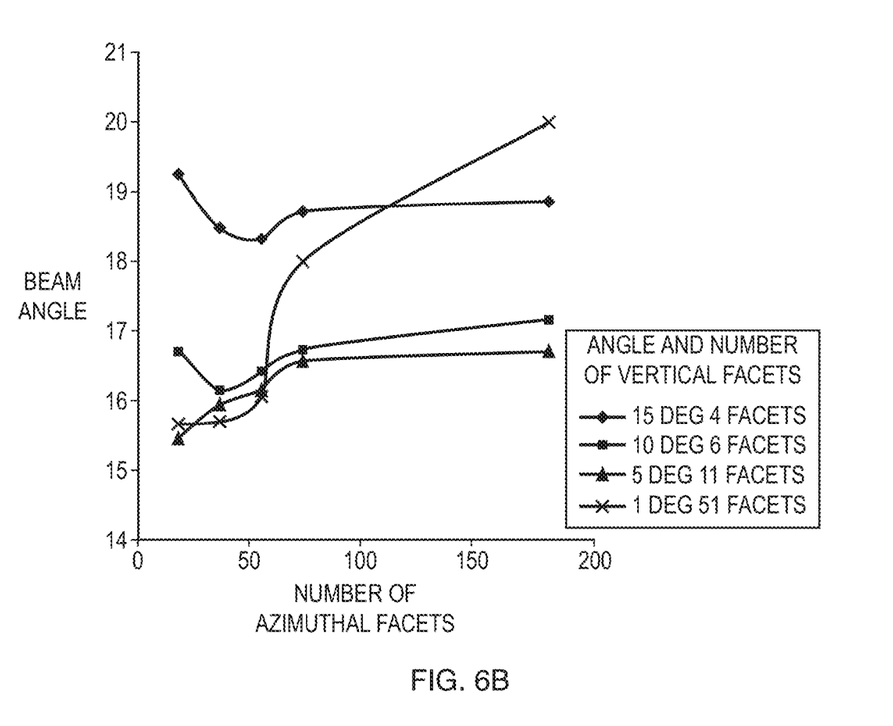

FIGS. 6A and 6B illustrate the effect of various numbers of facets in the vertical direction (for the paraboloid) and the azimuthal direction (for the paraboloid and central lens) on the center beam brightness and beam divergence quantitatively. As can be seen from a comparison of FIG. 6A with FIG. 6B, there is an overall negative correlation between center beam brightness and beam divergence. Further, while the beam divergence generally increases as the facets become larger and less numerous, the extreme case of large numbers of facets in both the vertical and the longitudinal directions causes a particularly high divergence. This effect is due to the imaging of the light source for a nearly smooth optic, and the resulting "hole" in the beam center, which pushes out the points of maximum beam brightness, from which the drop to half-maximum intensity is measured.

The optimal design of an optic in accordance herewith depends on the desired beam characteristics, which, as illustrated previously, generally involve a trade-off between low beam divergence and high beam uniformity and between non-uniformities of different physical origin. In quantifying the performance of the optic, the various beam parameters may be of different relative relevance for different applications. One approach to determining an optimal (or near-optimal) design includes specifying a maximum allowable beam divergence—for example, in terms of an absolute beam divergence angle (e.g., 20° or in terms of beam broadening relative to the baseline divergence achieved with a smooth optic (e.g., 20% increase, 10% increase, or 5% increase in the angle of divergence)—and then varying the facet dimensions, within the constraints imposed by the desired beam divergence, to minimize beam uniformities. In applications where the beam divergence is less crucial, the facets may, alternatively, be sized to optimize the trade-off between imaging of the light source and unwanted artifacts created by the facets. In yet another approach, a desirable degree of beam uniformity is specified (e.g., so as to ensure that the beam profile does not contain any visible local variations in brightness), and the beam divergence is minimized, or the central beam brightness maximized, under this constraint. For example, as a 5% contrast between a dark feature and a surrounding bright beam area is usually clearly visible, the tolerable level of local variations in beam brightness may be set to a level below 5%, e.g., to 1%. Of course, as explained above, the various beam performance parameters are related. For example, a "donut hole" in a beam pattern affects both beam divergence and beam uniformity. with a "donut hole," a For optics with central lens features, the number of facets may, in principle, be determined independently for the paraboloid and lens in both the vertical and azimuthal directions. However, to retain the radial symmetry of the lens, the number of azimuthal segments is often constrained to be the same for the paraboloid and lens. In many embodiments, the facets all cover the same vertical and azimuthal angles; however, the angle may, alternatively, vary along the surface of the optic. For example, the facets may all have the same length (i.e., vertical dimension) or same area, resulting in larger angular coverage for facets closer to the focal plane. Further, while various preferred embodiments utilize planar facets, the facets may, in some embodiments, be curved in one or two dimensions. Curved facets may result from a deliberate design choice to improve certain beam characteristics, or be a consequence of manufacturing practicalities. For example, it may be difficult to create a convex lens feature with perfectly planar facets meeting at a sharp point in the front. To avoid manufacturing inaccuracies, the sharp tip may be deliberately rounded off to merge the most frontal row of lens facets into a uniformly curved surface.

For a given set of desired beam characteristics, the optimal size(s) of the facets depends, among other things, on the overall size of the light source as well as the number, size, and arrangement of the individual dies and the spacing between them. For example, as the separation between the dies gets larger, the light needs to be "mixed up" more to obscure the boundaries, generally requiring larger facets. As the light source itself gets more uniform, smaller facets may be used as artifacts resulting from the facets are more easily avoided. Further, if the LED array includes a die at the center, the problem of a dark hole in the beam center is avoided; in this case, the optic may be designed without a central lens, or the central lens may include a large number of small azimuthal segments. The facet size also depends on the shape and dimensions of the optic; a shallower parabola (i.e., one with a smaller angle of coverage) is typically less sensitive to faceting, i.e., allows for larger vertical facet dimensions. The total number of facets depends, of course, on the sizes of both the facets and the optics (larger optics requiring more facets of a particular size).

In accordance with empirical results, various preferred embodiments have central lenses with between one and four (e.g., two) vertical segments. (With only one vertical segment, the central lens would take the shape of a cone or pyramid with as many side faces as there are azimuthal facets.) The paraboloid is segmented such that each facet covers, vertically, an angle between about 5° and about 10°. Larger facets tend to broaden the beam too much, whereas smaller facets obscure the LED array insufficiently. The number of azimuthal facets (for both the paraboloid and the central lens) is preferably in the range from about 30 to about 60. For fewer than 30 facets, the beam profile tends to exhibit a visible star pattern, and for more than 60 facets, the light source is imaged noticeably. The performance of the optic is, typically, good when the total number of facets (of the paraboloid and central lens) is about fifty times to about one hundred times the number if dies in the array.

Figure 7:
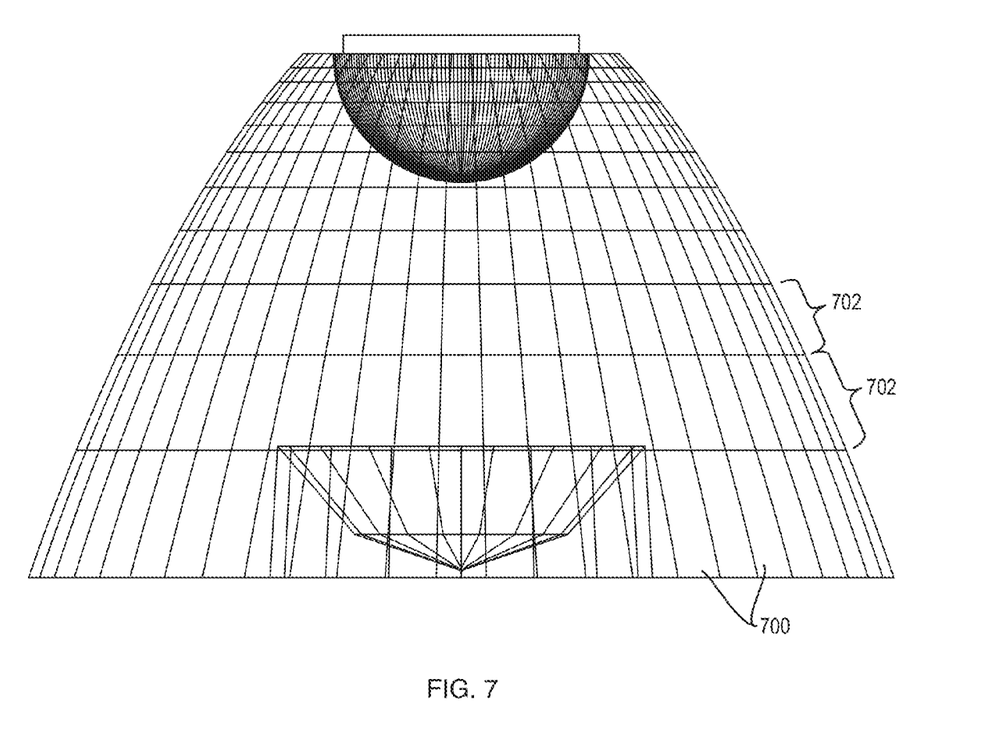
FIG. 7 is a side view of a faceted parabolic optic with a faceted central lens feature in accordance with one embodiment.

FIG. 7 depicts a preferred design of an optic in accordance with one exemplary embodiment. The light beam generated by this optic is free of visible optical artifacts, despite the light originating from twelve LED dies, and has a beam divergence of only about 16° and a high central beam brightness. As shown, the paraboloid is divided into 54 azimuthal segments 700 of 6.66° each and eleven vertical segments 702 of 5° each. The largest facets have an area of 8.4 mm$^2$, about half the size of the die area of approximately 16 mm$^2$. The central lens is divided into two vertical segments and 54 azimuthal segments. Accordingly, the total number of facets in this embodiments is about 700, about 58 times the number of dies.

TIR optics in accordance with various embodiments of the present invention can be manufactured using conventional injection-molding processes, as are well-known to persons of skill in the art. Once the shape of the faceted optic has been determined, that shape may be transferred to a block of metal to form a mold. For example, a metal tool, such as a router bit or drill bit, may be used to route or drill a precise hole of the desired shape into the block, typically in a tightly temperature-controlled environment to prevent distortion to the desired features. The tool may be impregnated with a fine diamond dust, which provides a protective layer that will resist wear, extending the usable life of the tool. The block is preferably of a metal soft enough to allow for quick drilling, yet hard enough to perform the functions of a mold; suitable metals include, e.g., copper or nickel. Alternatively to machining the interior surface of the mold, a master lens may be formed from a hard, yet machinable material, such as steel of machinable ceramic, and then used to create the mold.

The finished mold is filled with a suitable optical material, such as, for example, polymethylmethacrylate (PMMA) (acrylic glass), polycarbonate, silicone, other transparent plastic, or glass to form the optic. To manufacture an optic with front or back features (such as a recessed lens or a concave entrance surface), a double-cavity mold may be employed. This mold may be formed in two parts by the same method as described above. The two parts are assembled to close the mold, optical material is inserted, and the optic is formed and then removed from the double-cavity mold.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. For example, the specific examples of optics provided herein are optimized for use in conjunction with a 12-die array, but the underlying design principles and trends can be readily extended to optics for use with other light sources. Further, while faceting is illustrated with respect to TIR optics, various design considerations are equally applicable to metallic reflector optics. Accordingly, the described embodiments are to be considered in all respects as only illustrative and not restrictive.

What is claimed is:

1. An optic for use in conjunction with an extended light source comprising a plurality of discrete light sources, the optic comprising:
    a solid paraboloid structure formed of a substantially transparent material and having:
        a first end comprising an exit surface at which a light beam generated by the plurality of discrete light sources exits the optic and a second end at which the plurality of discrete light sources are disposed, and
        an outer surface comprising a plurality of planar quadrilateral facets;
    a convex lens structure disposed on the exit surface of the solid paraboloid structure, the convex lens structure being centered on an axis of the solid paraboloid structure at a length from the second end such that a plurality of rows of facets are disposed on the solid paraboloid structure along the length between the second end and the entire convex lens structure;
    wherein the facets are sized and arranged such that a light beam exiting the first end of the optic, is substantially free of images of the discrete light sources and artifacts resulting from faceting.

2. The optic of claim 1, wherein the brightness of the beam varies locally by less than 3%.

3. The optic of claim 1, wherein the brightness of the beam varies locally by less than 1%.

4. The optic of claim 1, wherein the brightness of the beam varies locally by 0.3%.

5. The optic of claim 1, wherein a beam divergence angle exceeds a baseline beam divergence angle by less than 5%.

6. The optic of claim 1, wherein, when the optic is used in conjunction with an extended light source that does not emit light at the symmetry axis of the paraboloid, the brightness of the beam is not substantially lower in a center than in regions surrounding the center.

7. The optic of claim 1, wherein, when the optic is used in conjunction with an extended light source that does not emit light at the symmetry axis of the paraboloid, the beam comprises a substantially uniform center portion.

8. The optic of claim 1, wherein the convex lens surface is recessed from the first end.

9. The optic of claim 1, wherein the convex lens surface protrudes from the first end.

10. The optic of claim 1, wherein the convex lens surface is faceted.

11. The optic of claim 10, wherein the convex lens surface divided into two facets in a vertical direction.

12. The optic of claim 1, wherein a total angular coverage of the convex lens and the paraboloid exceeds 75°.

13. The optic of claim 1, wherein a total angular coverage of the convex lens and the paraboloid exceeds 80°.

14. The optic of claim 1, wherein a total angular coverage of the convex lens and the paraboloid exceeds 85°.

15. The optic of claim 1, wherein the outer surface is divided into at least thirty and no more than sixty facets in an azimuthal direction.

16. The optic of claim 1, wherein a vertical angular extent of the planar facets of the outer surface is in the range from about 5° to about 10°.

17. The optic of claim 1, wherein all of the facets have substantially the same vertical angular extent.

18. The optic of claim 1, wherein the extended light source comprises twelve light-emitting diodes and the outer surface of the optic has an angular extent of about 50.5° and is divided into eleven facets into a vertical direction and into 54 facets in an azimuthal direction.

19. The optic of claim 1, wherein a total number of facets of the optic is in the range from about fifty times to about one hundred times the number of discrete light sources within the extended light source.

20. The optic of claim 1, wherein the second end of the optic coincides with the focal plane of the paraboloid.

21. The optic of claim 1, wherein the paraboloid is truncated at the second end.

22. The optic of claim 1, wherein the solid structure further has a concave entrance face recessed from the second end for receiving light from the plurality of discrete light sources.

23. An optic for use in conjunction with an extended light source comprising a plurality of discrete light sources, the optic comprising:
    a solid paraboloid structure formed of a substantially transparent material and having:
        an outer surface comprising a plurality of planar quadrilateral facets having vertices that collectively define a faceted paraboloid,
        a first end comprising an exit surface at which a light beam generated by the plurality of discrete light sources exits the optic and a second end at which the plurality of discrete light sources are disposed,
    a convex lens structure disposed on the exit surface of the solid paraboloid structure, the convex lens structure being centered on an axis of the solid paraboloid structure at a length from the second end such that a plurality of rows of facets are disposed on the solid paraboloid structure along the length between the second end and the entire convex lens structure;
    wherein the facets are sized and arranged such that a light beam exiting a first end of the optic, opposite a second end of the optic at which the extended light source is disposed, is substantially uniform in brightness and has a beam divergence angle that exceeds a baseline beam divergence by less than 10%.

24. The optic of claim 23, wherein the beam divergence exceeds the baseline beam divergence by less than 5%.

25. An optic for use in conjunction with a plurality of discrete light sources collectively forming an extended light-emitting surface, the optic comprising:
   a solid structure formed of a substantially transparent material and defining a truncated paraboloid having:
      a first end comprising an exit surface at which a light beam generated by the plurality of discrete light sources exits the optic and a second end at which the plurality of discrete light sources are disposed, and
      a convex lens structure disposed on the exit surface the convex lens structure being centered on an axis of the truncated paraboloid at a length from the second end such that a plurality of rows of facets are disposed on the truncated paraboloid along the length between the second end and the entire convex lens structure;
      a surface of the truncated paraboloid comprising a plurality of planar quadrilateral facets having vertices that collectively define the truncated paraboloid, and the surface of the convex lens structure being faceted so as to substantially eliminate non-uniformities of the extended light-emitting surface in a beam exiting the solid structure at the exit surface.

\* \* \* \* \*